(12) United States Patent
Simon et al.

(10) Patent No.: US 8,937,770 B2
(45) Date of Patent: Jan. 20, 2015

(54) EXCIMER LASER APPARATUS PROJECTING A BEAM WITH A SELECTIVELY VARIABLE SHORT-AXIS BEAM PROFILE

(75) Inventors: Frank Simon, Göttingen (DE); Paul Van Der Wilt, Göttingen (DE); Ludwig Schwenger, Hannover (DE)

(73) Assignee: Coherent GmbH, Göttingen (DE)

( * ) Notice: Subject to any disclaimer, the term of this patent is extended or adjusted under 35 U.S.C. 154(b) by 360 days.

(21) Appl. No.: 13/557,073

(22) Filed: Jul. 24, 2012

(65) Prior Publication Data

US 2014/0027417 A1   Jan. 30, 2014

(51) Int. Cl.
*G02B 27/10* (2006.01)
*G02B 13/08* (2006.01)
*G02B 27/09* (2006.01)
*B23K 26/00* (2014.01)
*H01L 21/02* (2006.01)

(52) U.S. Cl.
CPC ............ *G02B 27/09* (2013.01); *G02B 27/095* (2013.01); *B23K 26/0042* (2013.01); *B23K 26/0081* (2013.01); *H01L 21/02532* (2013.01)
USPC ....... 359/626; 359/668; 359/622; 219/121.65

(58) Field of Classification Search
CPC .. G02B 27/09; G02B 27/0905; G02B 27/095; B23K 26/0042; B23K 26/0081; B23K 26/0608; B23K 26/0648; B23K 26/0652; B23K 26/0676; B23K 26/0732; B23K 2201/40; H01L 21/02532; H01L 21/02686
USPC ............ 219/121.65; 359/621, 622, 626, 668, 359/738
See application file for complete search history.

(56) References Cited

U.S. PATENT DOCUMENTS

| | | | |
|---|---|---|---|
| 6,548,781 B1 * | 4/2003 | Brunwinkel | 219/121.73 |
| 6,773,142 B2 * | 8/2004 | Rekow | 362/259 |
| 6,913,373 B2 * | 7/2005 | Tanaka et al. | 362/268 |
| 7,016,393 B2 * | 3/2006 | Anikitchev et al. | 372/101 |
| 7,151,046 B2 | 12/2006 | Takeda et al. | |
| 7,180,671 B2 * | 2/2007 | Cho | 359/621 |
| 7,236,239 B2 * | 6/2007 | Hase | 356/124 |
| 7,355,800 B2 * | 4/2008 | Anikitchev | 359/710 |
| 7,408,714 B2 * | 8/2008 | Windpassinger et al. | 359/629 |
| 7,884,303 B2 * | 2/2011 | Partlo et al. | 219/121.65 |
| 2011/0228537 A1 * | 9/2011 | Yoshimizu et al. | 362/268 |

* cited by examiner

*Primary Examiner* — David N Spector
(74) *Attorney, Agent, or Firm* — Morrison & Foerster LLP

(57) ABSTRACT

Apparatus for homogenizing and projecting two laser-beams is arranged such that the projected homogenized beams are aligned parallel to each other in a first transverse axis and partially overlap in second transverse axis perpendicular to the first transverse axis. The projected homogenized laser-beams have different intensities in the second axis and the degree of partial overlap is selected such that the combined intensity of the laser beams in the second axis has a step profile.

20 Claims, 6 Drawing Sheets

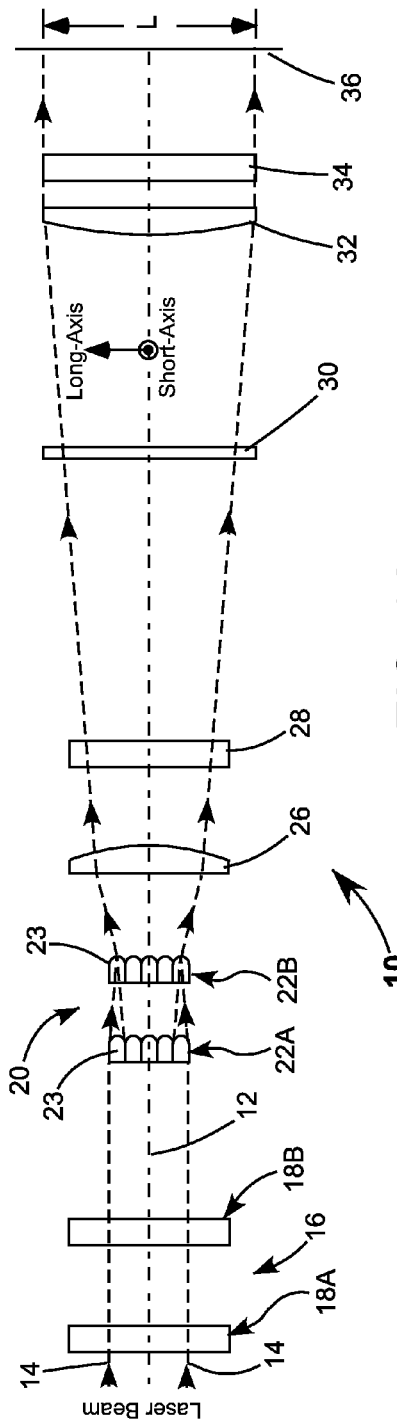
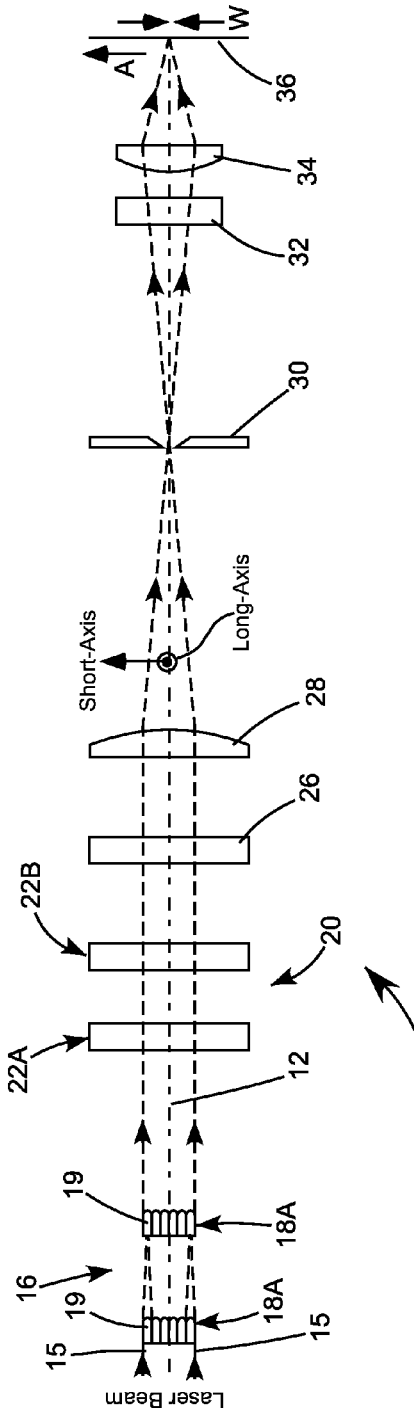
FIG. 1A (Prior Art)
FIG. 1B (Prior Art)

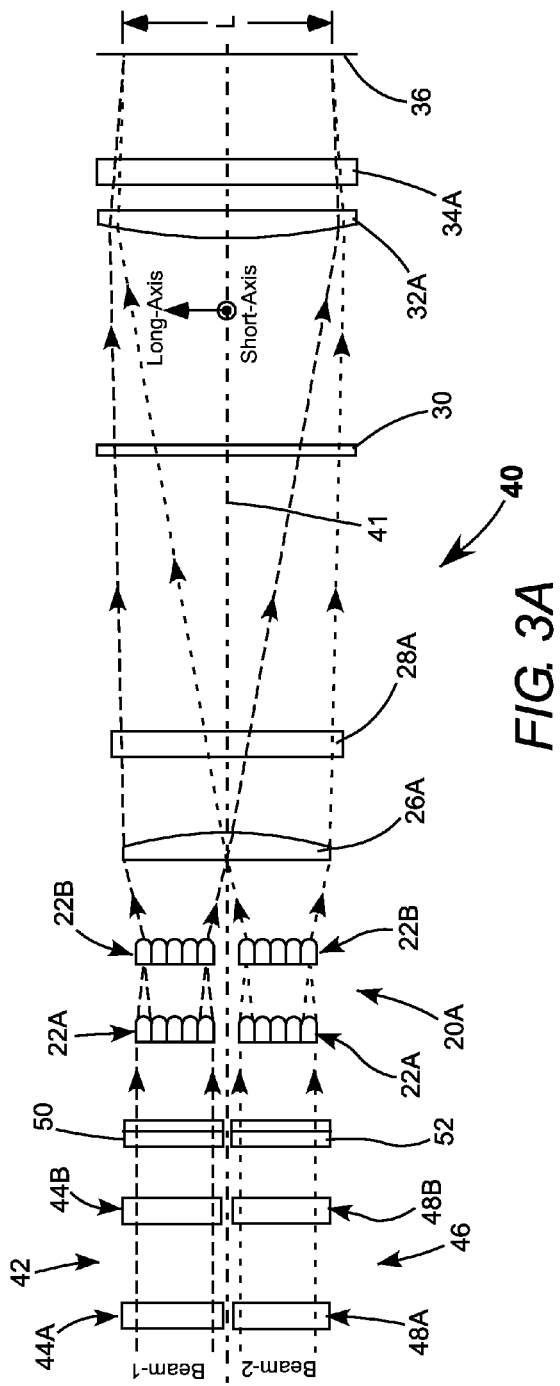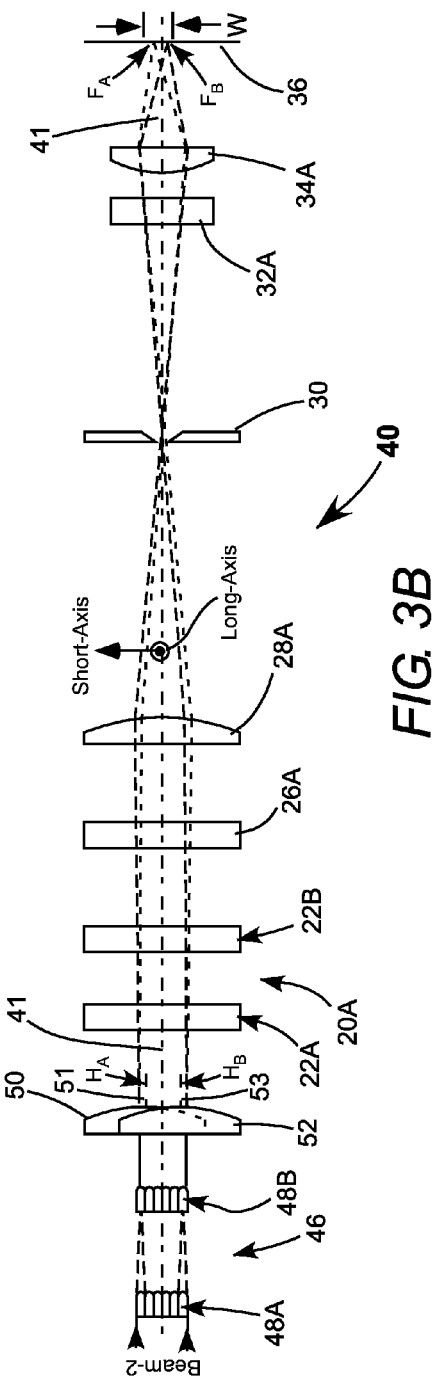
FIG. 3A
FIG. 3B

EXCIMER LASER APPARATUS PROJECTING A BEAM WITH A SELECTIVELY VARIABLE SHORT-AXIS BEAM PROFILE

TECHNICAL FIELD OF THE INVENTION

The present invention relates in general to melting and recrystallization of thin silicon (Si) layers by irradiation with laser-radiation beams. The method relates in particular to controlling the spatial profile of such beams.

DISCUSSION OF BACKGROUND ART

Silicon crystallization is a step that is often used in the manufacture of thin-film transistor (TFT) active-matrix LCDs, and organic LED (AMOLED) displays. The crystalline silicon forms a semiconductor base, in which electronic circuits of the display are formed by conventional lithographic processes. Commonly, crystallization is performed using a pulsed laser beam shaped in a long line. In this process, a thin layer of amorphous silicon on a glass substrate is repeatedly melted by pulses of laser radiation while the substrate (and the silicon layer thereon) is translated relative to a delivery source of the laser-radiation pulses. Melting and re-solidification (re-crystallization) through the repeated pulses take place until a desired crystalline microstructure is obtained in the film.

Optical elements are used to form the laser pulses into a line of radiation, and crystallization occurs in a strip having the width of the line of radiation. Every attempt is made to keep the intensity of the radiation pulses highly uniform along the line. This is necessary to keep crystalline microstructure uniform along the strip. A favored source of the optical pulses is an excimer laser, which delivers pulses having a wavelength in the ultraviolet region of the electromagnetic spectrum. The above described crystallization process, using excimer-laser pulses, is usually referred to as excimer-laser annealing (ELA).

FIG. 1A and FIG. 1B are respectively "long-axis" and "short-axis" views schematically illustrating one embodiment 10 of prior-art excimer laser annealing apparatus a laser beam having transverse axes perpendicular to each other is delivered to the apparatus from an excimer laser (not shown). The beam is longer in one of the transverse axes than in the other. For this reason these transverse axes are referred to by practitioners of the art as the long-axis and the short axis.

In the long-axis, as depicted in FIG. 1A, the laser beam, bounded by rays 14, passes through a short-axis homogenizer 16 including spaced apart arrays 18A and 18B of cylindrical lenses 19. These lenses have positive optical power in the short-axis only, having zero optical power in the long axis. After traversing the short-axis homogenizer the beam next traverses a long-axis homogenizer 20 including spaced apart arrays 22A and 22B of cylindrical lenses 23. These lenses have positive optical power in the long-axis only, having zero optical power in the short axis.

The beam then traverses, in sequence: a cylindrical lens 26 having positive optical power in the long-axis and zero optical power in the short-axis; a cylindrical lens 28 having positive optical power in the short-axis and zero optical power in the long-axis; a slit-aperture 30; a cylindrical lens 32 having positive optical power in the long-axis and zero optical power in the short-axis; and a cylindrical lens 34 having positive optical power in the short-axis and zero optical power in the long-axis.

Array 22A of homogenizer 20 divides the input beam into as many parts as there are cylindrical lenses in the array and converges these beam parts. The beam parts emerge diverging from lenses 23 in array 22B. Lenses 26 and 32 are configured and arranged such that each diverging beam-part from array 22A is spread to a long-axis pupil of apparatus 10 in which is located a layer 36 to be crystallized. The layer is supported on a glass pane (not shown) which in turn is supported on a translation stage (not shown). The effect of homogenizer 16 and lenses 26 and 32 is to create a flat-topped intensity distribution (intensity profile) along the long axis of the beam in the layer, as is known in the art. The length L of the beam on layer 36 is typically between about 300 mm and 1400 mm.

In the short axis, the input laser beam, bounded by rays 15 traverse short-axis homogenizer 16. Array 18A of homogenizer 16 divides the input beam into as many parts as there are cylindrical lenses 19 in the array and converges these beam parts. The beam parts emerge about collimated from lenses 19 in array 18B. Lenses 28 and 34 are configured and arranged such that each beam-part from array 22B is focused on layer 16. This provides that the short axis intensity distribution (intensity profile) on the layer is flat-topped in the manner of the long axis intensity distribution. The width W of the beam is typically between about 0.2 mm and 0.5 mm. The panel supporting layer 36 being crystallized is translated in the short axis direction relative to the focused beam as indicated in FIG. 1B by arrow A.

It should be noted that while arrays 16 and 20 are referred to above as homogenizer arrays, the arrays are actually only homogenizers when combined with condenser-lenses 28 and 26 respectively. A more accurate description would be lens-array pairs.

FIG. 2 is a graph schematically illustrating calculated intensity joules per cm (J/cm) as a function of short-axis distance for a beam in an example of apparatus 10. The beam has a short-axis width (FWHM) of about 0.4 mm. The vertical long dashed lines indicate typical translation increments of the beam width relative to layer 36 of FIG. 1B from one pulse to the next. In one preferred mode of operation, the translation speed of a layer-covered panel relative to the short-axis beam width is sufficiently slow that beam lines overlap, for example, by as much as 95% from one pulse to the next so any infinitesimal area receives a total of about 20 pulses. That is to say that the panel translates about one-twentieth of a beam-width from one pulse to the next.

The ELA process is a delicate process, and the error margin for the optimum energy density (OED) can be as small as 1%. It has also been observed that the OED can become smaller by more than this margin for an area of the film that has already been exposed to pulses.

A method for compensating for this OED variation during irradiation is described in U.S. Pat. No. 7,151,046. In this method, the intensity profile in the beam-width direction is formed into a step profile such that beam power increments lower after a predetermined number of the overlapping pulses. This stepped profile is achieved by placing absorbers at suitable positions in the beam path.

While the method of the '046 patent may be effective from the point of view of anticipating changes of OED with number of overlapping pulses, it is wasteful of laser energy. In the silicon recrystallization process a reduction of laser energy translates into a reduction in process throughput. Further, at the short wavelengths (less than 400 nm) of excimer laser radiation absorbers would be subject to damage, which at a minimum could alter the absorption values of the absorbers, and, accordingly, alter the step-profile. There is a need for an alternate method for achieving step-changes of power in the width direction of an excimer laser beam on a layer being crystallized.

SUMMARY OF THE INVENTION

The present invention is directed to optical apparatus for providing a laser beam spot for projecting an elongated beam-spot on a working plane, the beam spot having a long-axis, in which lies the length of the beam-spot, and a short-axis in which lies the width of the beam spot. In one aspect, apparatus in accordance with the present invention comprises beam generating apparatus providing first and second laser beams. First and second short-axis beam-homogenizers are provided for homogenizing the first and second laser beams on the working plane in the short-axis. First and second short axis short-axis focus-separating lenses are provided cooperative with the first and second short-axis beam-homogenizers. A long-axis beam homogenizer is provided for homogenizing the first and second laser beams on the working plane in the long-axis. Projection optics project the short-axis homogenized first and second beams in the working plane. The first and second short-axis beam-homogenizers, the short-axis focus-separating lenses, the long-axis beam-homogenizer, and the projection optics are configured and arranged such that the first and second laser-beams are aligned in the working plane in the long axis parallel to each other, defining the length of the beam-spot, and have respectively first and second short-axis beam-widths centered around respectively first and second focal points which are spaced apart in the working plane in the short-axis.

In a preferred embodiment of the invention the first and second beam-widths partially overlap in the short-axis. The first and second laser beams have equal power and the short-axis beam homogenizers are configured such that the first short-axis beam-width is less than the second short-axis beam-width, whereby the intensity of intensity of the projected first laser-beam in the working plane is greater than intensity of the projected second laser-beam in the working plane. The degree of the partial overlapping of the first and second short-axis beam widths is selected such that the combined intensity of the projected first and second beams in the short-axis has a step profile.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

FIG. 1A and FIG. 1B are respectively long-axis and short-axis views schematically illustrating prior-art apparatus for projecting a linear beam spot on a silicon layer from a single input laser-beam, the apparatus including a short-axis homogenizing lens-array pair, a long-axis homogenizing lens-array pair, short-axis and long-axis condenser lenses cooperative with the short-axis and long-axis array pairs, and short-axis projection optics.

FIG. 3A and FIG. 3B are respectively long-axis and short-axis views schematically illustrating one preferred embodiment of optical apparatus in accordance with the present invention for projecting a linear beam-spot on a silicon layer, similar to the apparatus of FIGS. 1A and 1B but where there are two input beams spaced apart in the long axis with a separate short-axis homogenizing lens-array pair for each beam each pair being followed by a focus-separating lens located between the short-axis homogenizing lens-array pairs and the long-axis homogenizing lens-array pairs with the focus separating lenses configured and arranged cooperative with other elements of the apparatus such that the two input beams are focused spaced apart in the short-axis with widths thereof partially overlapping to provide a combined short-axis energy-density distribution having a step profile.

DETAILED DESCRIPTION OF THE INVENTION

Figure 2:
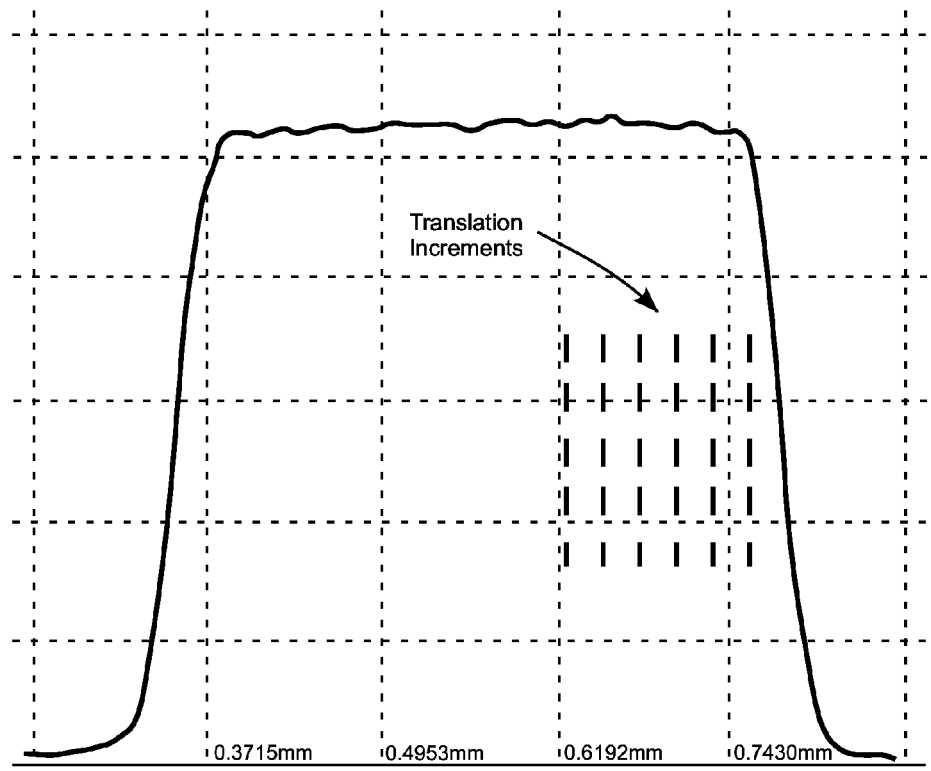
FIG. 2 is a graph schematically illustrating computed energy density as a function of short-axis distance in a beam spot projected by an example of the apparatus of FIGS. 1A and 1B, with the energy density being uniform over most of the short-axis width of the projected beam-spot.

Referring now to the drawings, wherein like components are designated by like reference numerals, FIG. 3A and FIG. 3B are respectively long-axis and short-axis views schematically illustrating a preferred embodiment 40 of excimer-laser annealing apparatus in accordance with the present invention. Apparatus 40 has a system axis 41. Apparatus 40 is configured to accept two laser beams designated beam-1 and beam-2. The beams propagate parallel to each other spaced-apart in the long-axis direction of the apparatus and aligned one above the other in the short-axis direction of the apparatus.

The two beams can be beams from two separate excimer lasers or can be created by dividing a single input beam. Examples of two separate beams depicted in FIG. 5A, and FIG. 5B. Examples of creating two beams from a single beam are shown in FIG. 5C and FIG. 5D.

Figure 5A:
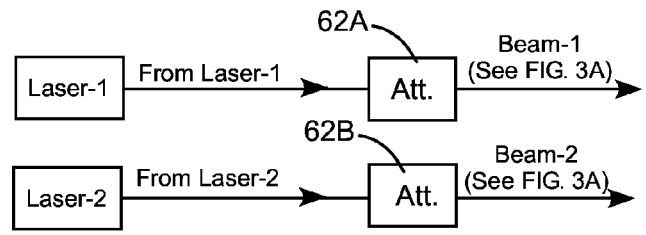
FIG. 5A, FIG. 5B, FIG. 5C, and FIG. 5D schematically illustrate four different arrangements for providing the two input beams of the apparatus of FIGS. 3A and 3B.

In the example of FIG. 5A there are simply two beams from two lasers, one beam from laser-1 and one beam from laser-2. These can be separately selectively attenuated by attenuators 62A and 62B, respectively, before being delivered to apparatus 40 as beam-1 and beam-2.

Figure 5B:
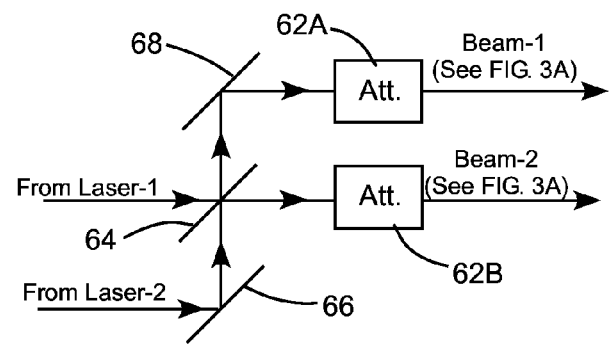

In the example of FIG. 5B there are also two beams from two lasers, one beam from laser-1 and one beam from laser-2. Here, however, the beam from laser-1 is incident on a partially transmitting and partially reflecting beam-splitter 64 with a transmitted portion delivered along a path to attenuator 62B, and a reflected portion directed by a fold-mirror 68 to attenuator 62A. The beam from laser-2 is directed to beam-splitter 64 by a turning mirror 66. A reflection portion is directed to attenuator 62B and a transmitted portion is directed by mirror 68 to attenuator 62A. This provides a degree of pre-homogenization with beam-1 and beam-2 each containing a portion of the beams from laser-1 and laser-2.

Figure 5C:
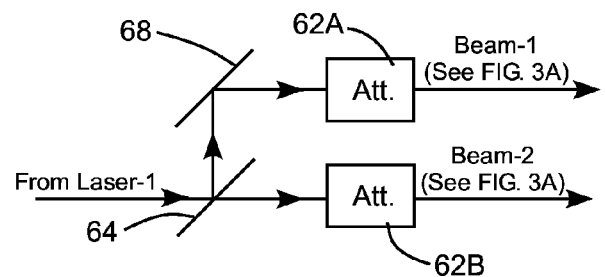
Figure 5D:
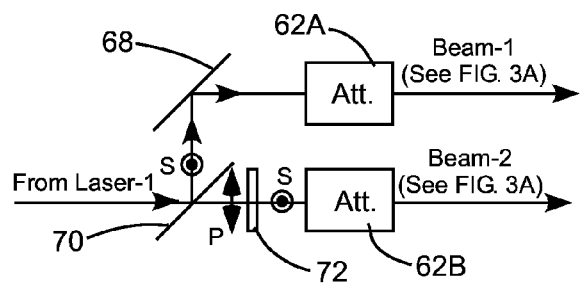

In the example of FIG. 5C, there is only one laser beam divided into a transmitted portion, which becomes beam-2 after attenuation in attenuator 62B, and a reflected portion, which is directed to attenuator 62A by mirror 68 and becomes beam-1. The polarization states of beam-1 and beam-2 will be the same.

The example of FIG. 5D is similar to that of FIG. 5C with an exception that beam-splitter 64 is replaced by a polarization-selective reflector (polarizing beam-splitter) 70. There is a transmitted p-polarized portion of the beam transmitted to attenuator 62B to become beam-2. A reflected s-polarized portion is directed by mirror 68 to attenuator 62A and becomes beam-1. The polarization orientations (perpendicular to each other) are correspondingly indicated by arrow P and arrowhead S. Optionally, a half-wave plate 72 can be placed in either the p-polarized (vertically polarized) or s-polarized (horizontally polarized) portions of the beam from laser-1 so that beam-1 and beam-2 have the same polarization orientation. Here, the half-wave plate is in the p-polarized path, providing that beam-1 and beam-2 are each horizontally polarized.

Referring again to FIG. 3A and FIG. 3B, apparatus is similar to apparatus 10 with inventive differences as follows. In apparatus 40 two cylindrical lens-array pairs of short-axis homogenizers 42 and 46 replace the single homogenizer lens-array pair 16 of apparatus 10 of FIGS. 1A and 1B. The two array pairs are located on opposite sides of system axis 41 in the long-axis. The array-pairs have a common short-axis condenser lens 28A. Positive cylindrical lenses 50 and 52 are added between short-axis arrays 42 and 46 respectively and a long-axis homogenizer lens-array pair 20A. Lens 50 intercepts beam-1 (only) and lens 52 intercepts beam-2 (only).

Here, the long-axis array pair is depicted as having two separate arrays 22A paired with two separate arrays 22B. This is merely for convenience of manufacture. There could be a single array 22A wide enough to accommodate both input beams with central lenses in the arrays unused. The arrangement has essentially the same function as the single lens-array pair 20 in prior-art apparatus 10 of FIG. 1A. The long-axis homogenization of the input beams is completed by a common long-axis condenser lens 26A cooperative with a common long axis lens 32A. A result of this is that both input beams are spread on layer 36 aligned with each other in the long-axis. For purposes of this description and the appended claims arrays 22A and 22B cooperative with long-axis condenser lens 26A can be defined a single long-axis homogenizer. Layer 36 can be defined as a working plane. Lens 32A is not in the strictest sense a projection lens but provides for telecentricity of the apparatus in the long axis.

In the short axis, lenses 50 and 52 are arranged with optical axes 51 and 53 (respectively) thereof respectively above and below (on opposite sides of) system axis 41. Optical axis 51 is at a height $H_A$ above axis 41, and optical axis 53 is at a height $H_B$ below axis 41. A result of this displacement in the short axis, beam-1 is focused on layer 36 at a focal point $F_A$ above axis 41 and beam-2 is focused on layer 36 at a focal-point $F_B$ below axis 41. The focused beams, of course, each have a finite short-axis beam-width. As a result of the short-axis homogenization, each beam has an about uniform intensity (energy density—ED) distribution on layer 36. If the input power of both input beams is the same, the intensity level in each beam will be determined by the short-axis width of each focused beam. These widths are determined by the configuration of lens-array pairs 42 and 46 cooperative with the short-axis condenser and projection optics which are common to both lens-array pairs.

If the input beams have equal power, and if the short-axis focused beam-widths are different, then the uniform short-axis ED will be different in each short-axis focused beam. By controlling the value of HA and HB for lenses 50 and 52, the positions of FA and FB can be controlled to provide a partial short-axis overlapping of the beams to provide a short-axis combined intensity distribution having a desired step-profile. In the long axis the input beams completely overlap on layer 36, and the combined long axis intensity on the layer is the sum of the intensities of the two projected beams.

Figure 4:
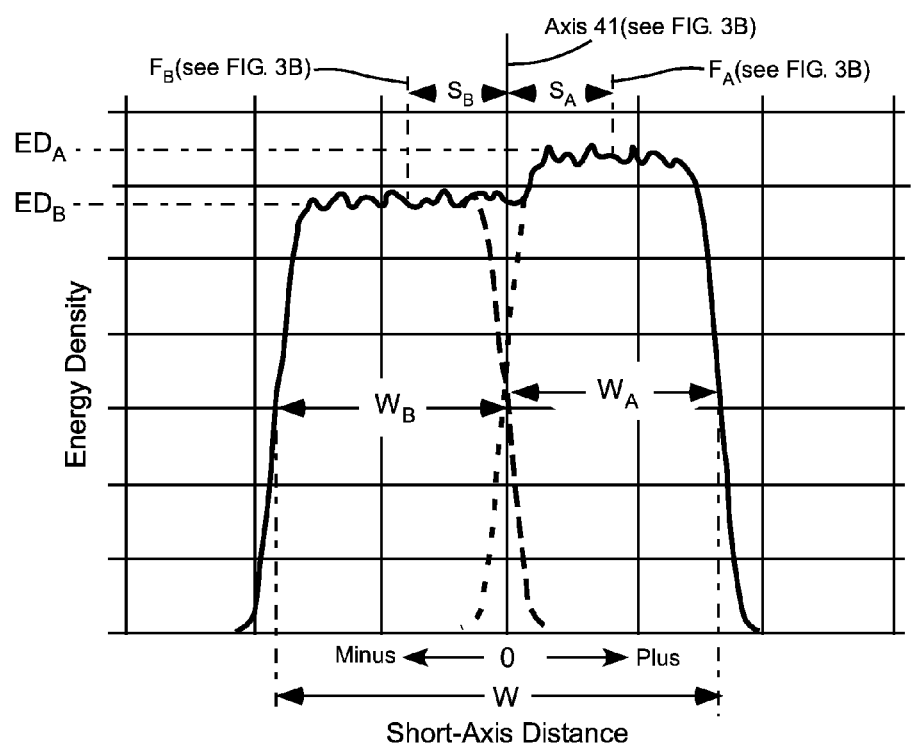
FIG. 4 is a graph schematically illustrating computed energy density as a function of short-axis distance in a beam-spot projected by an example of the apparatus of FIGS. 3A and 3B, with the energy density having the combined, step-profile, short-axis energy-density distribution.

FIG. 4 is graph schematically illustrating computed intensity, or ED, (solid curve) as a function of short-axis position for an example of apparatus 40. It is assumed that beam-1 and beam-2 have equal power. The outline of the profile of contributing individual beams is completed by dashed lines. Focal point $F_A$ (see FIG. 3B) is spaced by a distance $S_A$ of about 100 micrometers above axis 41. Focal point $F_B$ (see FIG. 3B) is spaced by a distance $S_B$ of about 100 micrometers below axis 41. The width $W_A$ of the short-axis focused beam-1 is less than the width $W_B$ of the short-axis focused beam-2 by an amount that provides that the higher energy-density $ED_A$ is about 10% greater than the lower energy density $ED_B$. In practice, an energy density step between about 2% and 10%, and preferably between 2% and 5% may be required. The combined energy distribution has a FWHM (W) of about 450 micrometers.

Figure 4A:
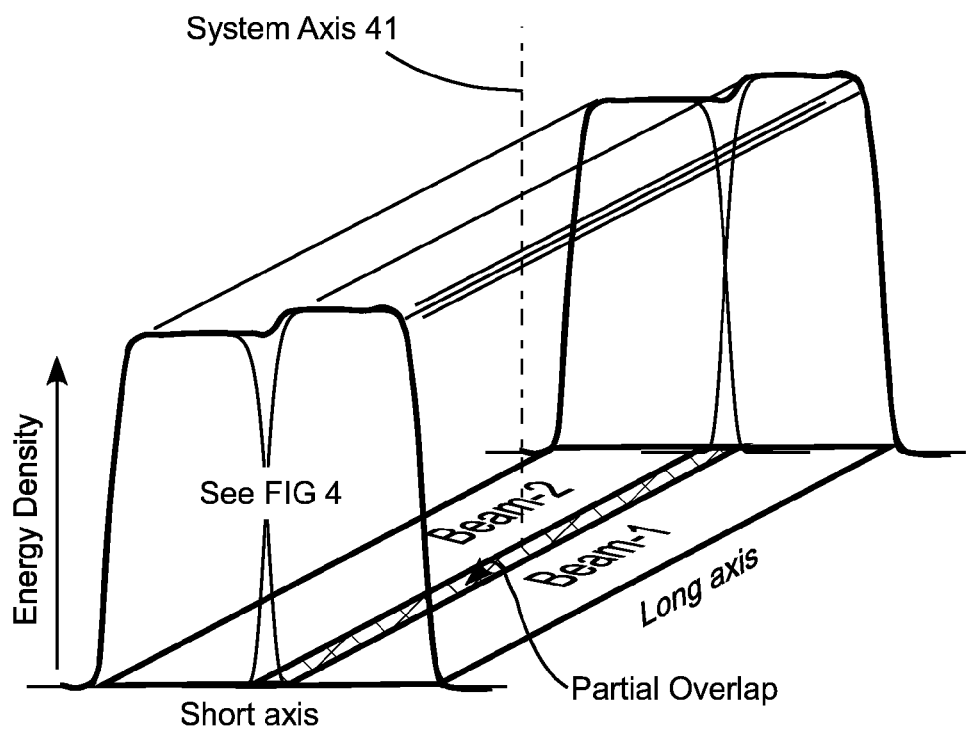
FIG. 4A is a three-dimensional view schematically illustrating the energy density distribution of FIG. 4 in both the long-axis and the short-axis.

A more complete picture, albeit schematic, is depicted in the three-dimensional representation of FIG. 4A. This depicts beam-1 and beam-2 parallel to each other in the long-axis defining the length of the beam spot having the step-profile. The width of the beam spot is defined by beam-1 and beam-2 partially overlapping in the short-axis.

In the computation, it assumed that beam-1 and beam-2 are collimated with each having equal short-axis width of 20 mm and equal long-axis width of 40 mm. It is assumed that lens arrays 44A and 44B (for beam-1) each comprised eleven individual lenses each having a focal length of 400 mm and a width (aperture height) of 2.0 mm and an axial thickness of 3.0 mm. The arrays were assumed to axially spaced apart by a distance 400.0 mm. It is assumed that lens arrays 48A and 48B (for beam-2) each comprise 11 individual lenses each having a focal length of 400.0 mm and a width (aperture height) of 2.2 mm and an axial thickness of 3.0 mm. These arrays are assumed to axially spaced apart by a distance 400.0 mm. It is assumed that lens 50 has focal length of 5.0 meters and an axial thickness of 20.0 mm. The optical axis height $H_A$ above axis 41 is assumed to be 10.0 mm. It is assumed that lens 52 has focal length of 5.0 meters and an axial thickness of 20.0 mm. The optical axis height $H_B$ below axis 41 is assumed to be 10.0 mm. The lenses are assumed to be axially spaced apart from arrays 44B and 48B by a distance of 100.0 mm. All lenses are assumed to be made from fused silica ($SiO_2$).

Initial specifications of remaining optical elements were selected according to prior-art design principles and optimization was performed using Zemax optical design software available from Radiant Zemax LLC of Redmond, Wash. It should be noted, however, that in the optimization, the adjustment of the parameters of elements 22A, 22B, 26A, 28A, 32A, and 34A, by the software will take into account the presence of focus-separating lenses 50 and 52, and the differently configured separate short-axis homogenizing arrays, none of which are present in prior-art apparatus exemplified by the apparatus of FIGS. 1A and 1B.

Referring again to FIG. 4, with continuing reference to FIGS. 3A and 3B, while the present invention is described above in terms of short-axis focusing beam-1 and beam-2 respectively above and below system axis 41, by displacing the optical axes of lenses 50 and 52 respectively above and below axis 41, this should not be considered limiting. In theory at least then optical axes of lenses 50 and 52 could both be above or below axis 41, at different heights of course to provide the required degree of short-axis partial overlap of the focused, homogenized input beams. In practice, however, such an arrangement may complicate the total system optimization, or not provide a desirable result at all.

It should also be noted that some desired short-axis intensity profiles may not be realizable using equal-power input beams with the intensity step height accomplished by adjusting the width of the short axis focused beams. By way of example, if the higher step is too narrow, using equal-power input beams the resulting step height (ED difference) may be greater than desired. This can be adjusted by adjusting input beam power. Referring again to FIGS. 5A-D beam power in any of the depicted arrangements could be adjusted by suitably adjusting attenuator 62A or 62B. In the arrangement of FIG. 5A the attenuators can be omitted and lasers driven at different pump powers to provide output beams of different power. In the arrangement of FIG. 5C the attenuators can be omitted and the splitting-ratio of beam-splitter selected to provide different power in beam-1 and beam-2. Attenuators may be required in any arrangement, however, for ELA process control reasons.

While the present invention is described above in terms of projecting two laser beams to create a short-axis intensity distribution with one step, those skilled in the art will recognize from the description of the invention provided herein, that three beams may be projected to three beams may be project to form a short-axis intensity distribution with two steps; four beams may be projected to form a short-axis intensity distribution with three steps; and, generally, N beams may be projected to form a short-axis intensity distribution with N−1 steps.

In summary, the present invention is described above in terms of a preferred embodiment. The invention is not limited, however, to the embodiment described and depicted. Rather, the invention is limited only by the claims appended hereto.

What is claimed is:

1. Optical apparatus for projecting an elongated beam spot on a working plane, the beam spot being derived from first and second laser beams, said apparatus having a long-axis, in which lies the length of the beam spot, and a short-axis in which lies the width of the beam spot, the apparatus comprising:
   first and second short-axis beam-homogenizers for homogenizing the first and second laser beams on the working plane in the short-axis;
   first and second short-axis focus-separating lenses cooperative with the first and second short-axis beam-homogenizers;
   a long-axis beam homogenizer for homogenizing the first and second laser beams on the working plane in the long-axis;
   projection optics for projecting the short-axis homogenized first and second beams in the working plane; and
   wherein the first and second short-axis beam-homogenizers, the short-axis focus-separating lenses, the long-axis beam-homogenizer, and the projection optics are configured and arranged such that the first and second laser-beams are aligned in the working plane in the long-axis parallel to each other defining the length of the beam-spot and have respectively first and second short-axis beam-widths centered around respectively first and second focal points spaced apart in the working plane in the short-axis.

2. The apparatus of claim 1 wherein the intensity of intensity of the projected first laser-beam in the working plane is between 2 and 5 percent greater than intensity of the projected second laser-beam in the working plane.

3. The apparatus of claim 1, wherein the first and second laser beams are generated by first and second lasers.

4. The apparatus of claim 3, further include a partially reflective and partially transmissive beam-splitter arranged to mix a first portion of the output of the first laser with a first portion of the output of the second laser to provide the first laser beam, and to mix a second portion of the first output beam with a second portion of the second output beam to provide the second laser beam.

5. The apparatus of claim 1 including a first laser providing an output beam and a partially reflective and partially transmissive beam-splitter arranged to divide the output beam into a first portion for providing the first laser beam and a second portion for providing the second laser beam.

6. The apparatus of claim 5, wherein the first and second laser-beams have the same polarization state.

7. The apparatus of claim 1, including a first laser providing an output beam and a polarizing beam-splitter arranged to divide the output beam into a plane-polarized first portion having a first polarization-orientation for providing the first laser beam and a plane-polarized second portion having a second polarization-orientation for providing the second laser beam, the first and second polarization orientations being perpendicular to each other.

8. The apparatus of claim 7, further including a polarization-rotator in the path of the second portion arranged to rotate the second polarization orientation to the first polarization orientation such the first and second laser beams are plane-polarized in the first polarization-orientation.

9. The apparatus of claim 1, wherein the first and second beam-widths partially overlap in the short-axis.

10. The apparatus of claim 9 wherein the first and second laser beams have equal power; the short-axis beam homogenizers are configured such that the first short-axis beam-width is less than the second short-axis beam-width, whereby the intensity of the projected first laser-beam in the working plane is greater than intensity of the projected second laser-beam in the working plane.

11. The apparatus of claim 10 wherein the intensity of the projected first laser-beam in the working plane is between 2 and 5 percent greater than intensity of the projected second laser-beam in the working plane.

12. The apparatus of claim 10 wherein the degree of the partial overlapping of the first and second short-axis beam-widths is selected such that the combined intensity of the projected first and second beams in the short-axis has a step profile.

13. Optical apparatus for projecting an elongated beam spot on a working plane, the beam spot having a long-axis, in which lies the length of the beam spot, and a short-axis in which lies the width of the beam spot, the apparatus comprising:
   beam generating apparatus providing first and second laser beams;
   first and second short-axis beam-homogenizers for homogenizing the first and second laser beams on the working plane in the short-axis;
   first and second short-axis focus-separating lenses cooperative with the first and second short-axis beam-homogenizers and each thereof having an optical axis;
   a long-axis beam homogenizer for homogenizing the first and second laser beams on the working plane in the long-axis;
   projection optics for projecting the short-axis homogenized first and second beams in the working plane; and
   wherein the first and second short-axis beam-homogenizers, the short-axis focus-separating lenses, the long-axis beam-homogenizer, and the projection optics are configured and arranged such that the first and second laser-beams are aligned parallel to each other in the working plane in the long-defining the length of the beam-spot and have respectively first and second short-axis beam-widths partially overlapping in the short axis defining the width of the beam spot.

14. The apparatus of claim 13, wherein the apparatus has a central axis, the optical-axes of the first and second short-axis focus-separating lenses are on opposite sides of the central axis in the short-axis direction, and the first and second beam widths are centered on opposite sides of the central axis in the short-axis direction.

15. The apparatus of claim 13, wherein the first and second short-axis focus-separating lenses have optical power in the short-axis only.

16. The apparatus of claim 13 wherein the beam-generating apparatus includes first and second lasers for providing respectively the first and second laser-beams.

17. The apparatus of claim 13 wherein the beam-generating apparatus includes a laser providing an output beam and a partially reflective and partially transmissive beam-splitter arranged to divide the output beam into a first portion for providing the first laser-beam and a second portion for providing the second laser-beam.

18. The apparatus of claim 13, wherein the beam-generating apparatus includes a laser providing an output beam and a polarizing beam-splitter arranged to divide the output beam into a plane-polarized first portion having a first polarization-orientation for providing the first laser-beam and a plane-polarized second portion having a second polarization-orientation for providing the second laser-beam, the first and second polarization orientations being perpendicular to each other.

19. The apparatus of claim 13 wherein the intensity of the projected first laser-beam in the working plane is greater than intensity of the projected second laser-beam in the working plane and the partial overlap is arranged such that the combined intensity of the projected first and second beams in the short-axis has a step profile.

20. The apparatus of claim 19 wherein the intensity of the projected first laser-beam in the working plane is between 2 and 5 percent greater than intensity of the projected second laser-beam in the working plane.

\* \* \* \* \*